United States Patent
Kanda et al.

(10) Patent No.: US 7,372,761 B2
(45) Date of Patent: May 13, 2008

(54) SEMICONDUCTOR DEVICE, NONVOLATILE SEMICONDUCTOR MEMORY, SYSTEM INCLUDING A PLURALITY OF SEMICONDUCTOR DEVICES OR NONVOLATILE SEMICONDUCTOR MEMORIES, ELECTRIC CARD INCLUDING SEMICONDUCTOR DEVICE OR NONVOLATILE SEMICONDUCTOR MEMORY, AND ELECTRIC DEVICE WITH WHICH THIS ELECTRIC CARD CAN BE USED

(75) Inventors: Kazushige Kanda, Kanagawa (JP); Koichi Kawai, Kanagawa (JP); Hiroshi Nakamura, Kanagawa (JP); Kenichi Imamiya, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/521,694

(22) Filed: Sep. 15, 2006

(65) Prior Publication Data

US 2007/0008803 A1    Jan. 11, 2007

Related U.S. Application Data

(60) Continuation of application No. 11/337,999, filed on Jan. 24, 2006, now Pat. No. 7,123,526, which is a continuation of application No. 11/052,558, filed on Feb. 7, 2005, now Pat. No. 7,016,241, which is a division of application No. 10/322,349, filed on Dec. 18, 2002, now Pat. No. 6,870,786.

(30) Foreign Application Priority Data

Dec. 19, 2001    (JP)    .............................. 2001-386222

(51) Int. Cl.
*G11C 7/00*    (2006.01)

(52) U.S. Cl. ...................................... 365/226; 365/228
(58) Field of Classification Search ................ 365/226, 365/228, 227
See application file for complete search history.

(56) References Cited

U.S. PATENT DOCUMENTS

| | | | |
|---|---|---|---|
| 5,640,349 A | 6/1997 | Kakinuma et al. | 365/185.33 |
| 5,663,901 A | 9/1997 | Wallace et al. | 365/52 |
| 5,664,231 A | 9/1997 | Postman et al. | 710/73 |

(Continued)

FOREIGN PATENT DOCUMENTS

JP    64-076306    3/1989

(Continued)

*Primary Examiner*—Vu A. Le
(74) *Attorney, Agent, or Firm*—Hogan & Hartson LLP

(57) ABSTRACT

The object is to avoid an erroneous operation during a term in which an initialization is performed when a command is input.

After a power source is turned on, a low level of a power-on-reset signal PWONRSTn is output until it reaches a power-on detect level. It is inverted by an inverter IN11, and input to a NOR circuit NR 11 likewise commands 1 and 2, so that a status is set to a busy status. The busy status is kept during a term in which a initialization operation is performed until the power supply voltage reaches the power-on detect level. Further, the status is read out to the exterior by a status read out mode signal to notify a user. As a result, it prevents from being input a command by an erroneous operation of a user during the initialization operation term.

17 Claims, 16 Drawing Sheets

U.S. PATENT DOCUMENTS

| | | | |
|---|---|---|---|
| 5,892,942 A | 4/1999 | Ohnishi et al. | 713/1 |
| 6,016,560 A | 1/2000 | Wada et al. | 714/718 |
| 6,052,313 A * | 4/2000 | Atsumi et al. | 365/189.05 |
| 6,462,985 B2 * | 10/2002 | Hosono et al. | 365/185.09 |
| 6,532,181 B2 | 3/2003 | Saito et al. | 365/200 |
| 6,556,479 B2 | 4/2003 | Makuta et al. | 365/185.09 |
| 2001/0047473 A1 | 11/2001 | Fallon | |
| 2004/0213066 A1 | 10/2004 | Imamiya | 365/222 |

FOREIGN PATENT DOCUMENTS

JP  01-205321  8/1989

\* cited by examiner

US 7,372,761 B2

SEMICONDUCTOR DEVICE, NONVOLATILE SEMICONDUCTOR MEMORY, SYSTEM INCLUDING A PLURALITY OF SEMICONDUCTOR DEVICES OR NONVOLATILE SEMICONDUCTOR MEMORIES, ELECTRIC CARD INCLUDING SEMICONDUCTOR DEVICE OR NONVOLATILE SEMICONDUCTOR MEMORY, AND ELECTRIC DEVICE WITH WHICH THIS ELECTRIC CARD CAN BE USED

CROSS REFERENCE TO RELATED APPLICATION

This is a continuation of application Ser. No. 11/337,999 filed Jan. 24, 2006 now U.S. Pat. No. 7,123,526, which is a continuation of application Ser. No. 11/052,558 filed Feb. 7, 2005 now U.S. Pat. No. 7,016,241, which is a divisional of application Ser. No. 10/322,349 filed Dec. 18, 2002 now U.S. Pat. No. 6,870,786, the entire contents of which are incorporated by reference. This application is based upon and claims benefit of priority under 35 USC 119 from the Japanese patent application Ser. No. 2001-386222, filed on Dec. 19, 2001, the entire contents of which are incorporated herein by reference.

BACKGROUND OF THE INVENTION

The present invention relates to a semiconductor device, a nonvolatile semiconductor memory, a system including a plurality of semiconductor devices or nonvolatile semiconductor memories, electric card including a semiconductor device or nonvolatile semiconductor memory, and an electric device with which this electric card can be used.

FIG. 12 shows the circuit configuration of a generally used nonvolatile semiconductor memory. This nonvolatile semiconductor memory includes a memory cell array MCA, address buffer ABF, column decoder CDC, row decoder RDC, sense amplifier S/A, fuse register FRG, I/O buffer IOBF, power-on reset circuit PORC, control circuit CT101, and voltage generation circuit VGC.

The memory cell array MCA has normal memory cell areas MC1 and MC2 for storing data, and a ROM fuse RF for storing data (to be referred to as fuse data hereinafter) required to be read out after the power source is turned on. Examples of the fuse data are fuse data for replacing defective portions in the memory cell areas MC1 and MC2 with other redundancy circuits, and trimming data for adjusting a timer and voltage generator.

Of input data to the address buffer ABF, a column address is input to and decoded by the column decoder CDC, a row address is input to and decoded by the row decoder RDC, and data write or read with respect to the memory cell array MCA is performed at the designated address. When data is to be read out, the data is output via the sense amplifier S/A and I/O buffer IOBF. When data is to be written, the data is supplied to the memory cell array MCA via the I/O buffer IOBF. Also, the fuse data stored in the ROM fuse RF is supplied to and held in the fuse register FRG via the sense amplifier S/A and column decoder CDC.

The voltage generation circuit VGC uses an externally supplied power source voltage VCC to generate various voltages such as a reference voltage Vref and program voltage Vpg.

The power-on reset circuit PORC outputs a low-level, power-on reset signal PWONRSTn before the power source voltage reaches a power-on detection level V2 after the power source is turned on. When the power source voltage reaches this power-on detection level V2, the power-on reset circuit PORC detects this and outputs a high-level, power-on reset signal PWONRSTn to the control circuit CT101.

While the power-on reset signal PWONRSTn is at low level, the control circuit CT101 initializes the address buffer ABF, fuse register FRG, column decoder CDC, sense amplifier S/A, row decoder RDC, and voltage generation circuit VGC by supplying a control signal indicating initialization to these components.

In addition, the above-mentioned fuse data stored in the ROM fuse RF must be read out and latched. If this fuse data is stored in a fuse circuit formed by a fuse which is blown by a laser, this fuse circuit is read. A read circuit for reading this fuse circuit is formed as a CMOS logic circuit. The level of a power source voltage with which this read circuit is activated is set to be equal to or higher than a voltage. Vlgc at which the CMOS logic circuit starts operating.

In the nonvolatile semiconductor memory as shown in FIG. 12, however, a specific area (the ROM fuse RF) in the memory cell array MCA can be allocated as a means for storing the fuse data.

In this case, the fuse data must be read out similar to normal data when the device is initialized. So, this data is readout from the ROM fuse RF (this operation will be referred to as ROM read hereinafter).

In this operation, as shown in FIG. 13, the power-on detection level V2 must be set higher than a minimum voltage V1 at which at least read operation is possible. Assume that, in a course during which the power source is turned on and the level rises, the power source voltage reaches the minimum operating voltage V1 at which read operation is possible at time T2, ROM read is started when the power source voltage reaches the power-on detection level V2 (V2>V1) at time T3, and this read is performed from time T3 to time T4. Accordingly, this ROM read is performed after initialization is complete. That is, the individual circuits are initialized after the power source is turned on and before the power source voltage reaches the power-on detection level V2. The power source voltage reaches the power-on detection level V2, and the power-on reset signal PWONRSTn changes from low level to high level, thereby completing the initialization. Then, ROM read is performed.

As described above, ROM read is desirably performed automatically when the power source is turned on (power ON), i.e., started immediately after initialization is complete after the power source is turned on. A signal for controlling this ROM read is generated by the control circuit CT101 which receives the high-level, power-on reset signal PWONRSTn output from the power-on reset signal PORC.

For example, a circuit shown in FIG. 14 is used in this power-on reset circuit PORC. The power source voltage VCC is divided by resistors R1 and R2, and a divided level N1 is supplied to the gate of a P-channel transistor PT1. This P-channel transistor PT1, a depression type transistor DT1, and a resistor R3 are connected between a power source voltage VCC terminal and ground terminal. The potential at the connection point of the drains of the transistors PT1 and DT1 is delayed by a delay circuit INC formed by an inverter array. This delayed potential is output as the power-on reset signal PWONRSTn.

The circuit configuration of the control circuit CT101 is as shown in FIG. 15. The power-on reset signal PWONRSTn input to this control circuit CT101 is supplied to a different control circuit OCT, a pulse generator PG11, and a ROM read controller RRC.

The pulse generator PG11 supplies, to a NAND gate NA11, a signal which is obtained by inverting the power-on reset signal PWONRSTn by an inverter IN11 and delaying this inverted signal by a delay circuit DL, and the power-on reset signal PWONRSTn, thereby generating a signal which is at low level only for the delay time. An inverter IN12 inverts this signal to apply an activation pulse ROMRDSTT to a set terminal Set.

The ROM read controller RRC is reset when the power-on reset signal PWONRSTn which is at low level after the power source is turned on is input to a reset terminal /Reset. When the activation pulse ROMRDSTT is input after that, the ROM read controller RRC generates a control signal for starting ROM read, and outputs this control signal to the individual circuits for performing ROM read.

Unfortunately, this conventional device has the following problems.

Assume that the power source is rapidly turned on. In this case, as shown in FIG. 16, the power source voltage VCC rises from time T0 and reaches the power-on detection level V2 at certain time. However, if this rise is too fast in accordance with the response of the power-on reset circuit PORC, the power source voltage is detected at time Tb as shown in FIG. 16, and the high-level, power-on reset signal PWONRSTn is output. Initialization is performed from time T0 to time Tb. As described previously, the ROM read operation is performed after time Tb.

At time Ta at which the initialization including ROM read has not been complete yet, the device status set in an R/B (Ready/Busy) pad indicates a ready state. Therefore, although the initialization has not been complete yet, the user may input a certain command by using an input program.

Also, to perfect the initialization when the power source is turned on, the specification generally recommends that a reset command be input after the power source is turned on. Accordingly, a reset command may be intentionally input.

If this reset command input at time Tb is ignored, reset may not be reliably performed because the user recognizes that the reset command is input and hence does not input the reset command again.

Furthermore, regardless of the reset command, the user may input a certain command, such as an initial value read command for reading out the initial value of software or the like or a status read command, before time Tb at which the initialization is complete. As in the above case, if this command input before the initialization is complete is ignored, an operation error may occur since the user recognizes that this command is input and hence does not input the command again.

SUMMARY OF THE INVENTION

A semiconductor device of the present invention comprises an initialization circuit for initializing a predetermined circuit in accordance with the level of a power source voltage, and a status setting unit for setting the status of the semiconductor device to "busy" during a period in which the initialization circuit performs initialization.

A nonvolatile semiconductor memory of the present invention comprises a fuse data storage for storing fuse data including replacement data for replacing a first area with a second area in a memory cell array, a fuse data read unit for reading out the fuse data from the fuse data storage, and a status setting unit for setting the status of the nonvolatile semiconductor memory, wherein the status setting unit sets the status of the nonvolatile semiconductor memory to "busy" until the fuse data read unit completes readout of the fuse data.

A nonvolatile semiconductor memory of the present invention comprises a fuse data storage for storing fuse data containing replacement data for replacing a first area with a second area in a memory cell array, a fuse data read unit for reading out the fuse data from the fuse data storage, and a control circuit for controlling a timing at which a predetermined circuit executes an externally input command, wherein if the command is input before the fuse data read unit completes readout of the fuse data, the control circuit holds the command and, after readout of the fuse data is complete, causes the predetermined circuit to execute the command.

DESCRIPTION OF THE PREFERRED EMBODIMENTS

Embodiments of the present invention will be described below with reference to the accompanying drawings. A semiconductor device in each embodiment includes no memory cell array. A nonvolatile semiconductor memory in each embodiment includes a memory cell array in addition to the configuration of a semiconductor device.

(1) First Embodiment

In this embodiment, the status of a device is set to "busy" while initialization is performed after the power source is turned on. More specifically, a voltage indicating a busy state is output from an R/B (Ready/Busy) pad. This makes it possible to reject inputting of external commands during initialization after the power source is turned on. Also, a user can read out status data set in the R/B pad from an I/O pad to the outside. This allows the user to check whether initialization is being performed or initialization is complete and commands can be input. In this way, during a period in which the power source is turned on and initialization is performed until the power source voltage reaches a power-on detection level, the device status is set to "busy". This status data is read out and notified to the user, thereby preventing inputting of commands. When a ready state is set after the initialization is complete, the user inputs a command to set the status to "busy".

Figure 1:
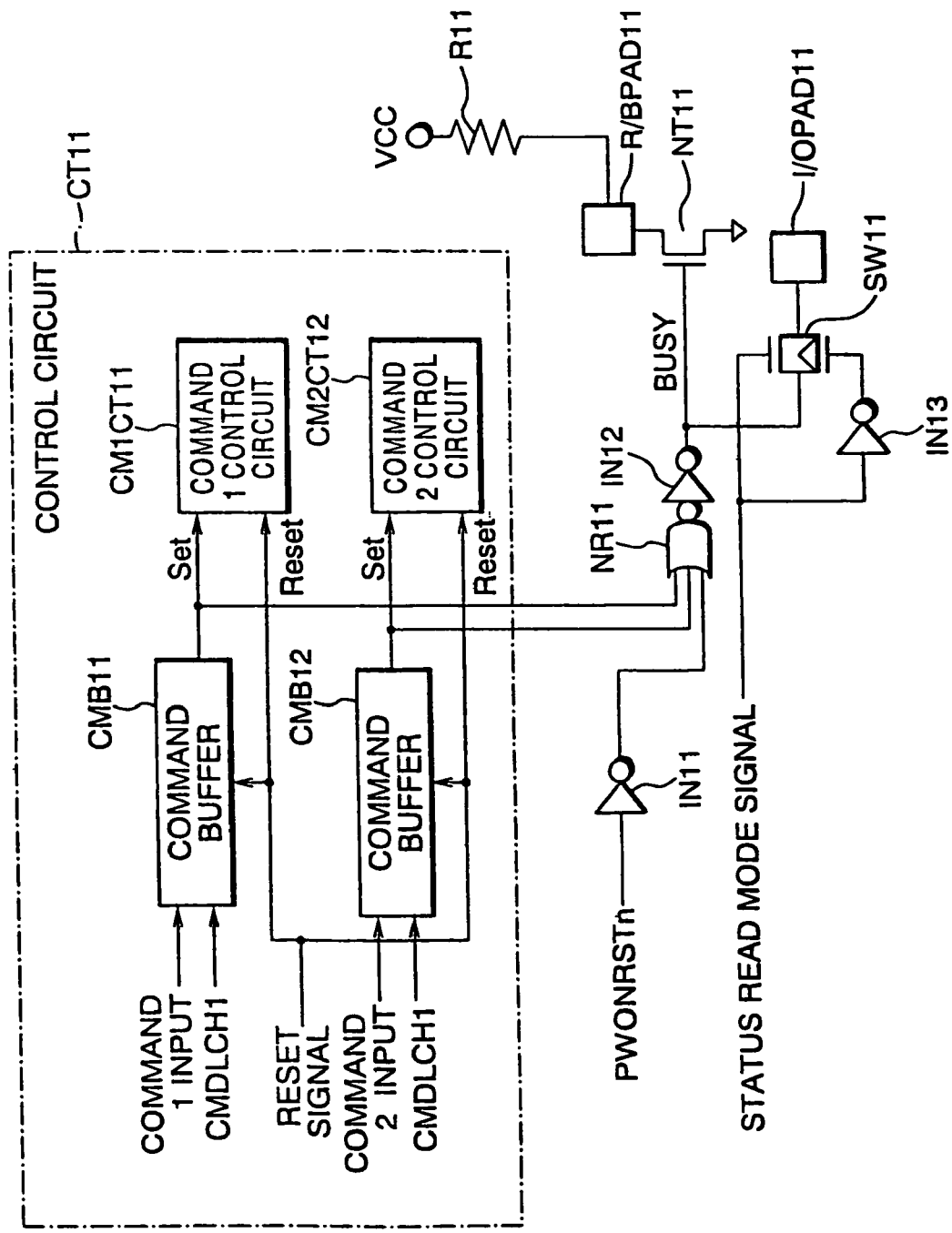
FIG. 1 is a circuit diagram showing the arrangement of the first embodiment of the present invention.

FIG. 1 shows the arrangement of this embodiment. This embodiment includes a control circuit CT11, inverters IN11, IN12, and IN13, a NOR gate NR11, a switching element SW11 which is a combination of P- and N-channel transistors, a resistor R11, an R/B pad R/BPAD11, and an I/O pad I/OPAD11. The control circuit CT11 has command buffers CMB11 and CMB12, a command 1 control circuit CM1CT11, and a command 2 control circuit CM2CT12.

When receiving any of a high-level command 1 latched by and output from the command buffer CMB11, a high-level command 2 latched by and output from the command buffer CMB12, and a high-level signal formed by inverting a low-level, power-on reset signal PWONRSTn by the inverter IN11 while the power source voltage does not reach a power-on detection level after the power source is turned on, the NOR circuit NR11 outputs a low-level signal, and this low-level signal is inverted into a high-level signal by the inverter IN12. This state is a busy state. In this state, this high-level potential is input to the gate of an N-channel transistor NT11. In a ready state, the R/B pad R/BPAD11 is at high level because a power source voltage VCC is applied via the resistor R11. In the busy state, however, the transistor NT11 is turned on to ground this R/B pad R/BPAD11, so the R/B pad R/BPAD11 is at low level.

In this embodiment as described above, the device status is set to "busy" during initialization after the power source is turned on, i.e., while the low-level, power-on reset signal PWONRSTn is output.

When a high-level status read mode signal is input to check whether the status is "busy" or "ready", this signal is input to the gate of the N-channel transistor of the switching element SW1 and inverted into a low-level signal by the inverter IN13. This low-level signal is input to the gate of the P-channel transistor to turn it on. Accordingly, the user can check the potential at the output node of the inverter IN12 by reading out status data from the I/O pad I/OPAD11 for reading out the status. The user does not input any commands in the busy state, and inputs commands in the ready state. If the command 1 or 2 is input in the ready state, the status is set to "busy".

The internal configuration of the control circuit CT11 will be explained below. During the period of initialization, a reset signal is supplied to the command buffers CMB11 and CMB12, command 1 control circuit CM1CT11, and command 2 control circuit CM2CT12 to reset these buffers and circuits. After this initialization is complete, one of the command buffers CMB11 and CMB12 which is given a command latch signal CMDLCH1 latches and outputs the input command 1 or 2 in accordance with the timing of the latch signal.

If the command 1 is selected and output from the command buffer CMBCMB11, this command 1 is input to one terminal of the NOR gate NR11 and to a set terminal Set of the command 1 control circuit CM1CT11. Consequently, the busy state is set after the initialization is complete as described above, and a control signal necessary to perform the operation of the command 1 is output from the command 1 control circuit CM1CT11 to circuits which operate in accordance with this command 1.

Similarly, if the command 2 is selected and output from the command buffer CMBCMB12, this command 2 is input to the other terminal of the NOR gate NR11 and to a set terminal Set of the command 2 control circuit CM1CT12. Consequently, the busy state is set, and a control signal necessary to perform the operation of the command 2 is output from the command 2 control circuit CM1CT12 to circuits which operate in accordance with this command 2.

This control signal for executing the command can be, e.g., a signal for controlling a timing at which a program voltage is generated if the command designates write, or a timing at which this program voltage is applied to a memory cell.

Figure 2:
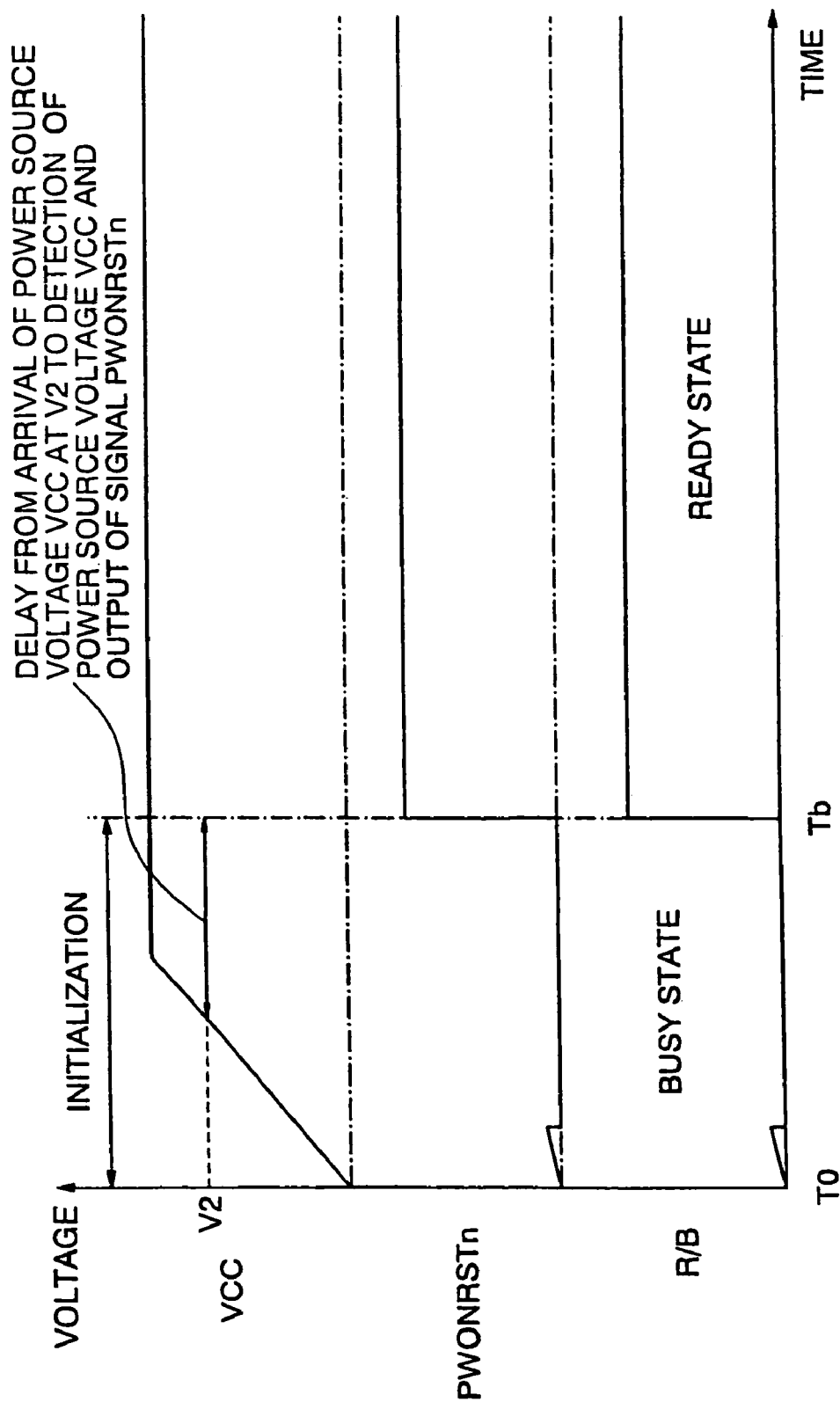
FIG. 2 is a timing chart showing changes in waveforms after the power source is turned on in the first embodiment.

FIG. 2 shows changes in the levels of the power source voltage VCC, power-on reset signal PWONRSTn, and R/B pad R/BPAD11 after the power source is turned on in this embodiment. In the conventional device, during the period of initialization in which the power-on reset signal PWONRSTn is at low level, the status data of the device and the power-on reset signal are not linked, so the status is set to "ready" in some cases. In this embodiment, however, the status is set to "busy" during the period (from time T0 to time Tb) of initialization.

Accordingly, the busy state is set and the corresponding status data can be read out until the initialization is complete. This permits the user to check whether inputting of a command is accepted.

Notifying the user of the "busy" status during the initialization period has the following meaning.

A period from turning-on of the power source to completion of initialization corresponds to a period during which the individual internal circuits are reset. It is logically possible to set the potential of the R/B pad R/BPAD11 such that this potential indicates the busy state. However, the set status data cannot be read out to the outside in order to read the status, if circuits for outputting this status data are not in operation.

In contrast, in this embodiment, the status is not logically set to "busy" during the period of initialization; the status can be automatically set by inputting the power-on reset signal PWONRSTn to the NOR gate NR11 similar to the commands 1 and 2. In addition, the status data can be read out by inputting a status read mode signal during the period of initialization.

In this embodiment as described above, during the period in which initialization is performed after the power source is turned on, the device status is set to "busy", and the status data is output to notify the user of the completion of the initialization. Accordingly, it is possible to prevent an operation error occurring when a command is input by mistake during the initialization period and this command is ignored and not executed.

The circuit shown in FIG. 1 sets the busy state during the initialization period before the power source reaches the power-on detection level after the power source is turned on. Therefore, this circuit is effective in a device in which ROM read need not be performed, or in a device in which although ROM read is necessary, this ROM read is not automatically activated but is performed in accordance with inputting of a command after initialization is complete.

Figure 3:
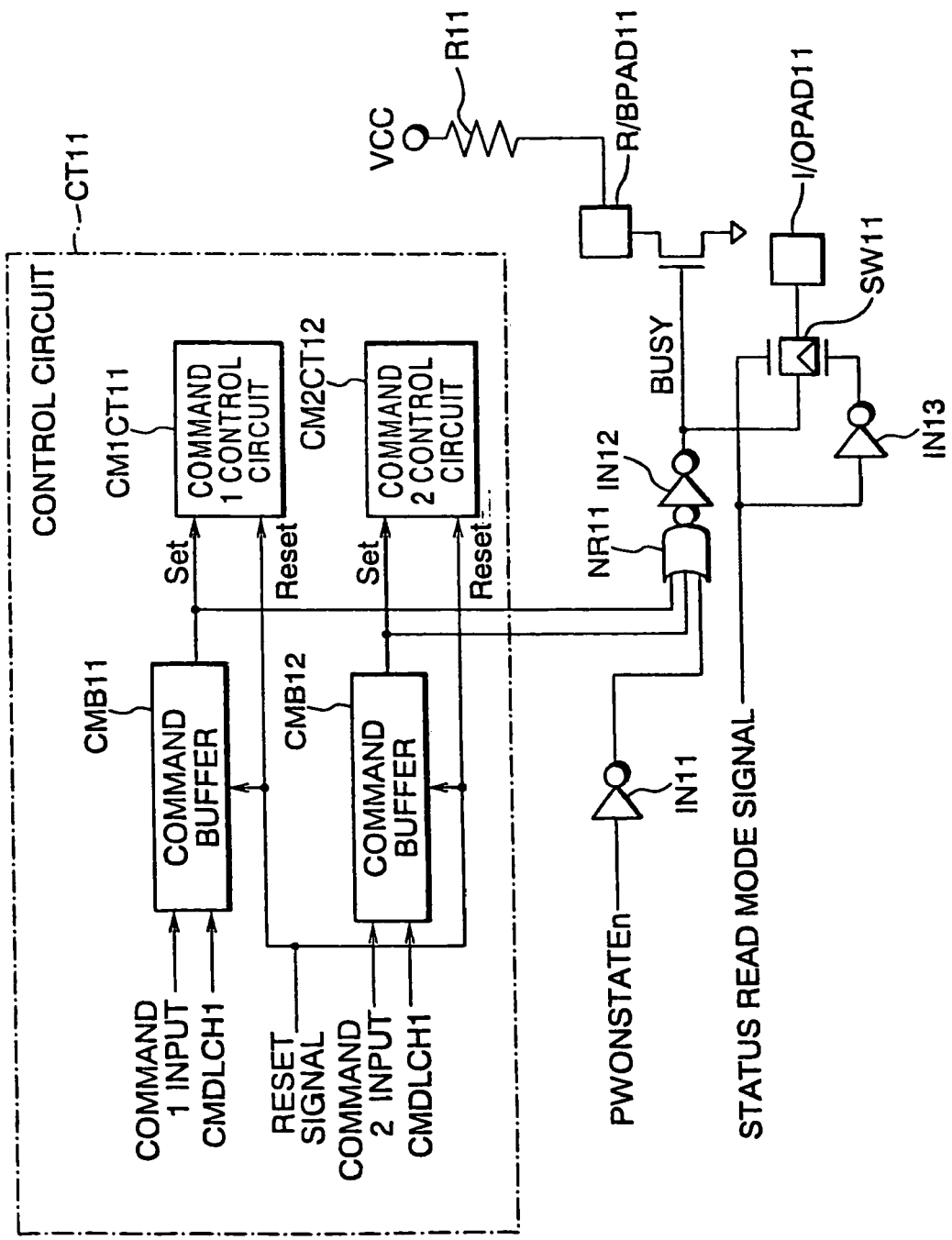
FIG. 3 is a circuit diagram showing an arrangement when a power-on status signal PWONSTATEn is used instead of a power-on reset signal PWONRSTn in the first embodiment.

In a device in which ROM read is automatically activated immediately after initialization is complete, as shown in FIG. 3, the circuit configuration is the same as shown in FIG. 1. However, a power-on state signal PWONSTATEn is desirably input to the inverter IN11. This signal PWONSTATEn can also be generated by using, e.g., the power-on reset signal PWONRSTn and a pulse signal ROMRDEND output at the same time ROM read is complete. More specifically, as will be described later with reference to FIG. 4, a high-level, power-on state signal PWONSTATEn can be generated by resetting an SR flip-flop by inputting a low-level, power-on reset signal PWONRSTn to its reset terminal, and setting this flip-flop by inputting the pulse signal ROMRDEND to its set terminal. As a consequence, the status is set to "busy" and the status data is read out and notified to the user during a period in which initialization is performed after the power source is turned on and ROM read which is started after the completion of this initialization is complete. Accordingly, no command is input until ROM read is complete.

(2) Second Embodiment

In this embodiment, if a preset predetermined command is input during the period of ROM read, this command is stored and executed immediately after the ROM read is complete. In this manner, a command input during the ROM read period is not ignored but is rapidly executed.

A predetermined command is a command which is desirably processed as soon as possible after the completion of ROM read, e.g., a command for reading out initial values. For example, initial values on software and initial values in a chip controller are data which is preferably read out as soon as possible when the chip is activated. If a user checks by using software whether ROM read is complete, the time is wasted depending on the time interval of detection. Therefore, such a predetermined command is held during the ROM read period and automatically executed when the ROM read is complete. In this way, the command is processed at high speed without causing the user to detect the ROM read completion timing.

On the other hand, examples of commands input during the ROM read period are a ROM read start command, ID read command, reset command, and status read command. These commands can be processed in parallel with ROM read, or require a forced interrupt.

Since these commands can be processed in parallel with ROM read or require a forced interrupt, it is meaningless to hold these commands during the ROM read period and execute them after the completion of ROM read. In this embodiment, therefore, if a preset predetermined command such as a command for reading out initial values is input during the ROM read period, this command is held and executed immediately after the ROM read is complete.

Figure 4:
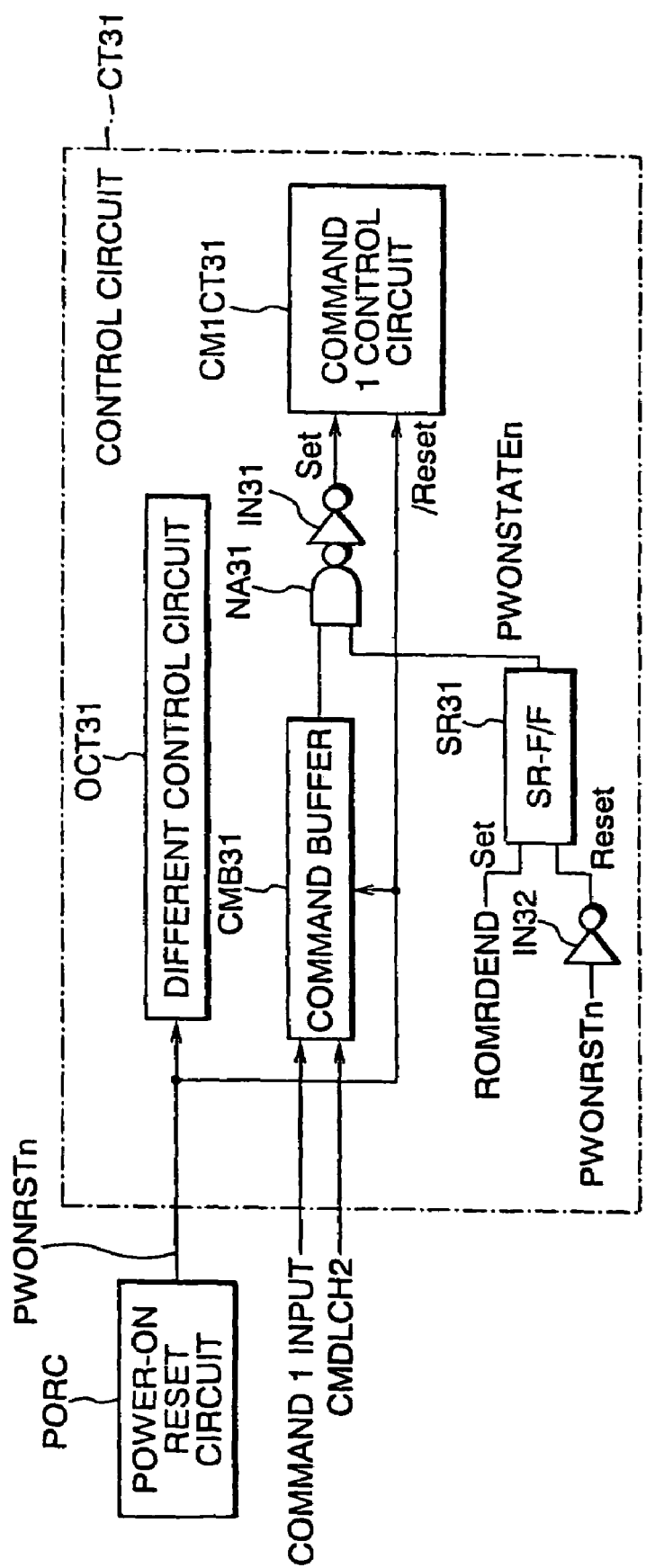
FIG. 4 is a circuit diagram showing the arrangement of the second embodiment of the present invention.

As shown in FIG. 4, this embodiment includes a power-on reset circuit PORC and control circuit CT31. This control circuit CT31 has a different control circuit OCT31, a command buffer CMB31, an inverter IN32, an SR flip-flip SR31, a NAND gate NA31, an inverter IN31, and a command 1 control circuit CM1CT31.

After the power source is turned on and before the power source reaches a predetermined level (power-on detection level), the power-on reset circuit PORC outputs a low-level, power-on reset signal PWONRSTn. When the power source reaches the predetermined level, the power-on reset circuit PORC detects this and outputs a high-level, power-on reset signal PWONRSTn. The low-level, power-on reset signal PWONRSTn is input to the different control circuit OCT31, the command buffer CMB31, and a reset terminal /Reset of the command 1 control circuit CM1CT31 to reset these buffer and circuits.

In accordance with a timing at which a command latch signal CMDLCH2 is input to a clock terminal CLK of the command buffer CMB31, an input command 1 is output as a latched high-level signal to one terminal of the NAND gate NA31. This NAND gate 31 ignores the input command 1 until a high-level signal is input to the other terminal from the SR flip-flop SR31.

The SR flip-flip SR31 is reset when the low-level, power-on reset signal PWONRSTn inverted by the inverter IN32 is input to a reset terminal Reset, and is set when a high-level, ROM read end signal ROMRDEND which is output at the same time ROM read is complete is input to a set terminal Set. This SR flip-flip SR31 outputs a low-level status signal PWONSTATEn which indicates a busy state, after the power source is turned on and before ROM read is complete. Simultaneously with the completion of ROM read, the SR flip-flop SR31 outputs a high-level status signal PWONSTATEn.

This status signal PWONSTATEn is input to the other input terminal of the NAND gate NA31. Accordingly, the command 1 input to the other input terminal is not output while ROM read is performed, and is output after being inverted when the ROM read is complete. The inverted command 1 output from the NAND gate NA31 is inverted by the inverter IN31 and input to a set terminal Set of the command 1 control circuit CM1CT31 to set this circuit. Consequently, control signals required to execute this command 1 are output to individual circuits for executing the command 1.

In this manner, the command 1 input during the period of ROM read is kept latched in the command buffer CMB31 and is not output to the command 1 control circuit CM1CT31. When this ROM read is complete, the command 1 is supplied to the command 1 control circuit CM1CT31, and control signals are output.

Figure 5:
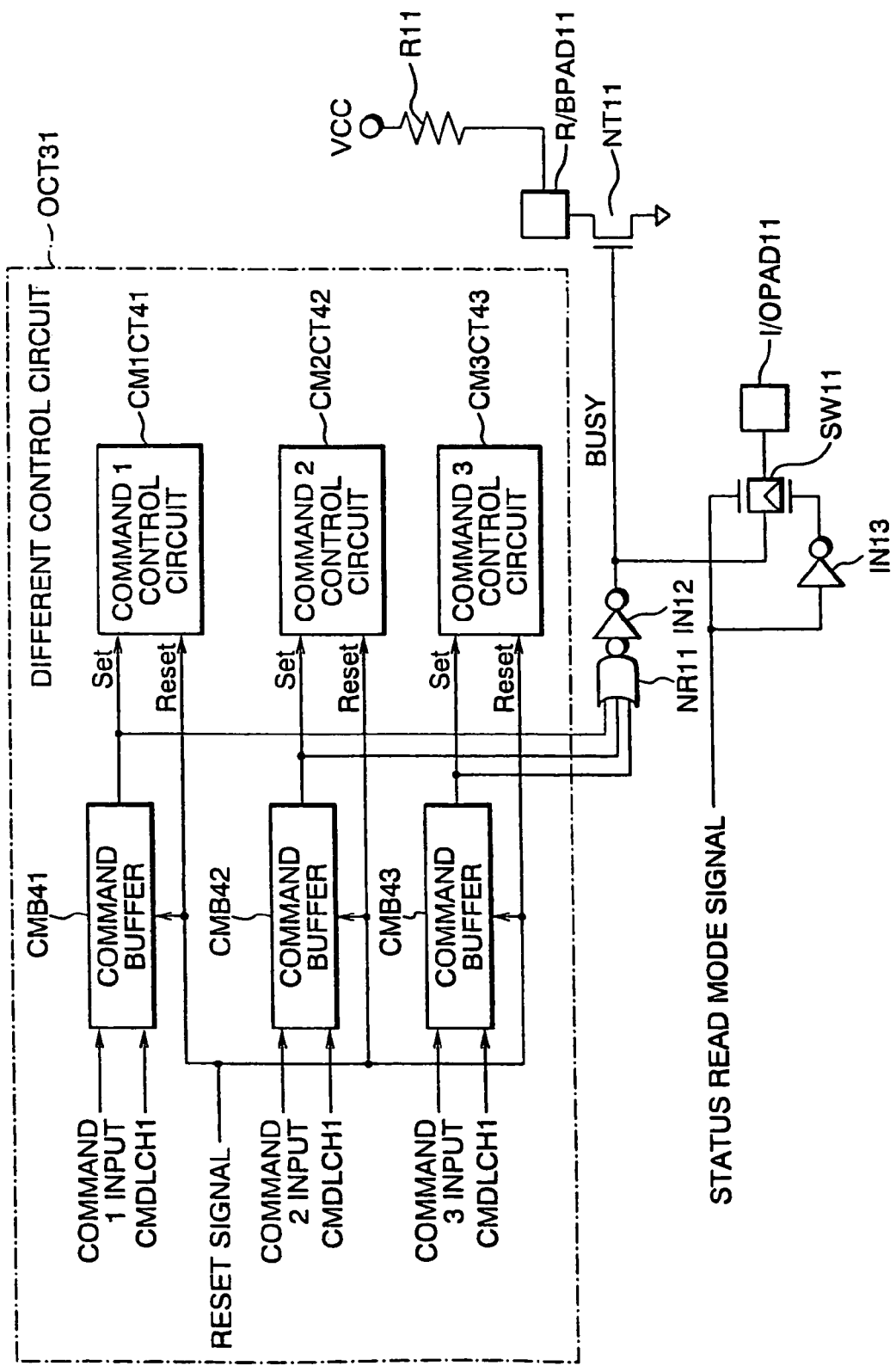
FIG. 5 is a circuit diagram showing the configuration of a different control circuit in the second embodiment.

FIG. 5 shows an example of the configuration of the different control circuit CM1CT31. This control circuit CM1CT31 has a plurality of command buffers CMB41, CMB42, and CMB43. These command buffers CMB41, CMB42, and CMB43 receive, latch, and output corresponding commands 1, 2, and 3, respectively, in accordance with the timing of a command latch signal CMDLCH1. These commands 1, 2, and 3 are output to a command 1 control circuit CM1CT41, command 2 control circuit CM2CT42, and command 3 control circuit CM3CT43, and control signals necessary to execute the commands 1, 2, and 3 are output to circuits for executing the corresponding commands.

If at least one of the commands 1 to 3 is output from the command buffers CMB41 to CMB43, this command is input to and inverted by a NOR gate NR11. The inverted signal is output to and inverted by an inverter IN12, and output as a high-level busy signal. After that, as in the circuit shown in FIG. 1, an R/B pad R/BPAD11 changes to low level, and the high-level busy signal is read out from an I/O pad I/OPAD11 to which a status read mode signal is input.

Since the different control circuit OCT31 has the above configuration, if at least one command is input, the status is set to "busy", and the corresponding status data can be read out.

Figure 6:
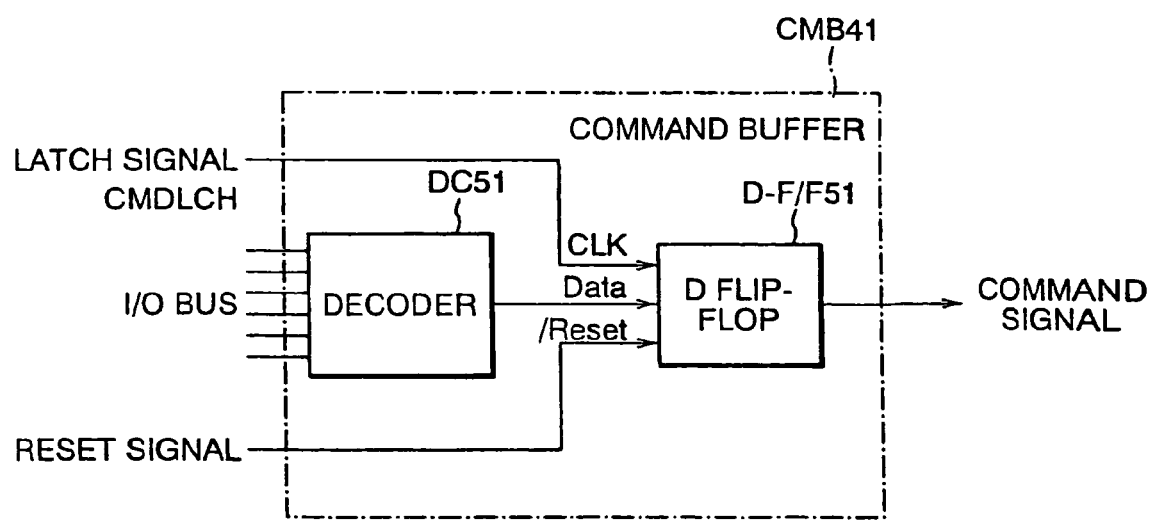
FIG. 6 is a circuit diagram showing the configuration of a command buffer in the second embodiment.

The command buffers CMB41 to CMB43 can have a circuit configuration as shown in FIG. 6. For example, the command buffer CMB41 includes a decoder DC51 and D flip-flop D-F/F51.

The decoder DC51 decodes an input command transferred from an I/O bus, and outputs the result as data Data to the D flip-flop D-F/F51.

This D flip-flop D-F/F51 is reset when a reset signal is supplied to a reset terminal/Reset. The D flip-flop D-F/F51 latches the data Data at a timing at which a latch signal CMDLCH is supplied to a clock terminal CLR, and outputs as a command signal to the corresponding command 1 control circuit CM1CT41.

Figure 7:
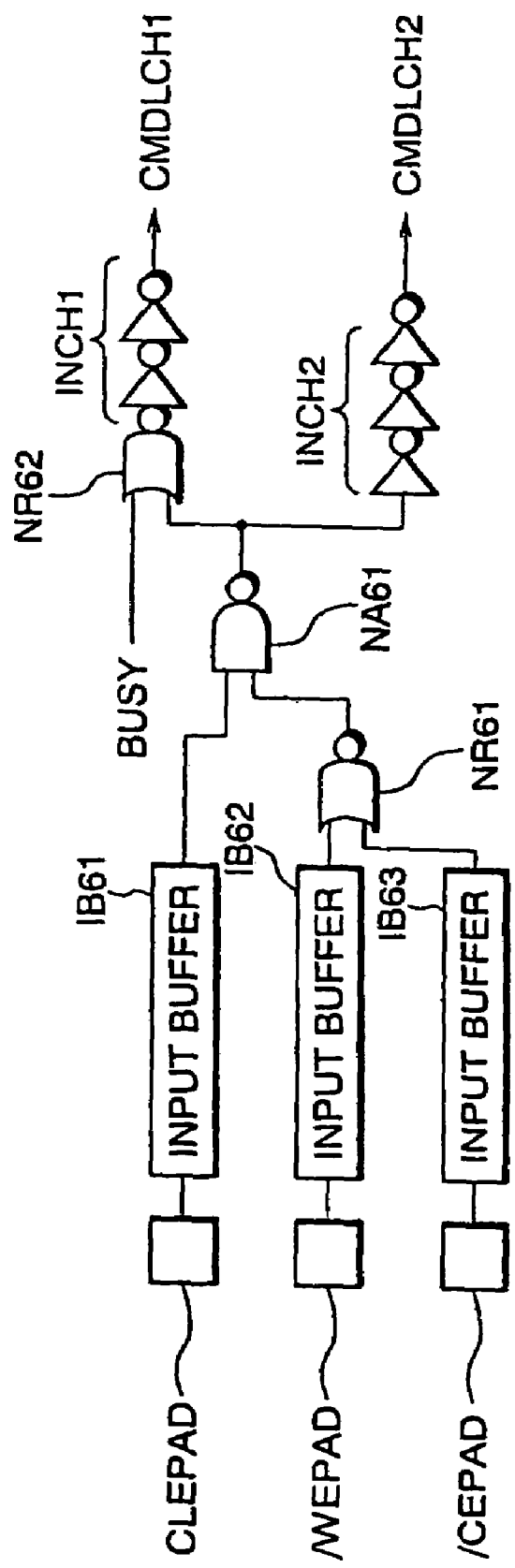
FIG. 7 is a circuit diagram showing the configuration of a circuit for generating a command latch signal in the second embodiment.

The command latch signal can also be generated by using a circuit as shown in FIG. 7. Referring to FIG. 7, the command latch signal is controlled by inputting of voltages (command latch enable CLE for activating a command latch operation, write enable /WE for defining an input data latch timing, and chip enable /CE for selecting and activating the chip) to three pads.

The voltages applied to a command latch enable pad CLEPAD, write enable pad /WEPAD, and chip enable pad /CEPAD are input to corresponding input buffers IB61 to IB63. If the command latch enable CLE is at high level to latch a command and the chip enable /CE is at low level, a NOR gate NR61 and NAND gate NA61 output the input data latch signal /WE. In this state, the command latch signals CMDLCH1 and CMDLCH2 can be generated.

One command latch signal CMDLCH can be generated only when no busy state is set (a busy signal BUSY is not at high level), i.e., only in a ready state, and the other command latch signal CMDLCH can be generated in both the ready state and busy state. In this embodiment, the former is the command latch signal CMDLCH1, and the latter is the command latch signal CMDLCH2. That is, of the commands 1 and 2, the command 2 can be input even in the busy state, and the command 1 cannot be input except in the ready state.

In the ready state, a NOR gate NR62 receives a low-level, busy signal BUSY and outputs high-level command latch signals CMDLCH1 and CMDLCH2. In the busy state, this NOR gate NOR62 receives a high-level busy signal BUSY and outputs only the command latch signal CMDLCH2 at high level.

The command latch signal CMDLCH1 input to the command buffers CMB11 and CMB12 shown in FIGS. 1 and 3 control inputting of commands which are not accepted in the busy state. The command latch signal CMDLCH2 input to the command buffer CMB31 shown in FIG. 4 controls inputting of commands which are accepted even in the busy state.

In this embodiment, even when a command is input during the ROM read period, this command can be latched and executed after the ROM read is complete. This avoids an operation error which may occur if the command is ignored.

(3) Third Embodiment

In the above second embodiment, if a command for reading out initial values is input during the period of ROM read, this command is held and executed after the ROM read is complete.

In this embodiment, however, commands which can be processed in parallel with ROM read or predetermined commands requiring a forced interrupt, e.g., a reset command, status command, ID read command, and ROM read start command, are input and executed even during a period in which ROM read is performed.

A ROM read start command is a command for starting ROM read. It is redundant to accept and execute this command during a period in which ROM read is already performed. However, in a period during which initialization is performed after the power source is turned, the power source voltage may not sufficiently rise. Therefore, the reliability of the result. of ROM read performed in this period is lower than that of the result of ROM read performed by executing the ROM read start command after the power source voltage has sufficiently risen. Accordingly, during ROM read automatically activated after the power source is turned on, this command can be accepted to restart ROM read.

An ID read command is a command for outputting the ID code of a chip. This ID code is data which is highly likely to be loaded into the system as chip information by the user immediately after the power source is turned on, in order to identify the type of chip. Examples of data of the contents are a manufacturer code, a product code, the number of chips in the case of multi-chip packaging, chip numbers when a number of chips are packaged, the number of bits as a write erase read unit, the number of bits of a redundancy circuit, the number of planes, a mask-version, and the number of input/output bits.

A reset command is used when forced reset is necessary. If a state like this occurs during the ROM read period, this command is input as an interrupt to perform reset. A status read command is a command for reading out whether the device is in a busy state or ready state as will be described later This command is executed by parallel processing.

Figure 8:
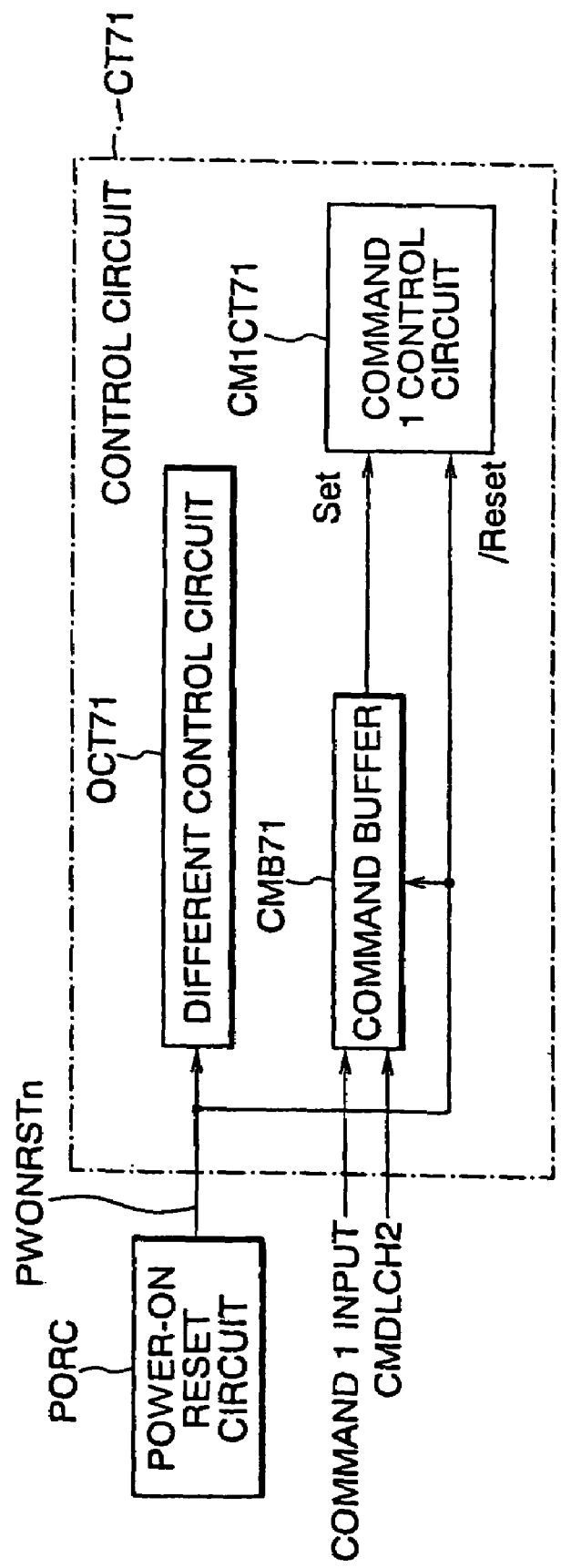
FIG. 8 is a circuit diagram showing the arrangement of the third embodiment of the present invention.

As shown in FIG. 8, this embodiment includes a power-on reset circuit PORC and control circuit CT71. This control circuit CT71 has a different control circuit OCT71, a command buffer CMB71, and a command 1 control circuit CM1CT71.

Before a power source voltage VCC reaches a predetermined level after the power source is turned on, a power-on reset signal PWONRSTn is at low level, so the different control circuit OCT71, the command buffer CMB71, and the command 1 control circuit CM1CT71 to which this signal is input are reset when the power source voltage reaches the predetermined level, the power-on reset signal PWONRSTn changes to high level.

When receiving a command latch signal CMDLCH2, the command buffer CMB71 latches and outputs an input command 1 in accordance with the timing of this signal. As in the second embodiment described above, the command latch signal CMDLCH2 allows inputting of a command even in the busy state. Accordingly, even in the busy state during the ROM read period, the command latch signal CMDLCH2 is supplied to the command buffer CMB71 to latch the command 1.

The latched command 1 is input to a set terminal Set of the command 1 control circuit CM1CT71 to set this circuit, and control signals for executing this command 1 are output to circuits for executing the command 1.

In this embodiment, a command which can be processed in parallel during the ROM read period or a predetermined command requiring a forced interrupt, e.g., an ID read command, is accepted and processed in parallel even during the ROM read period. This increases the processing speeds of these commands and initialization.

As described above, in the semiconductor device and nonvolatile semiconductor memory of each of the above embodiments, the device status is set to "busy" during a period in which an initialization circuit for initializing predetermined circuits in accordance with the level of the power source voltage is performing initialization. This avoids an operation error occurring when a command is input by mistake during the initialization.

As the fourth embodiment of the present invention, an electric card using the semiconductor device or nonvolatile semiconductor memory according to the first to third embodiments of the present invention and an electric device using this electric card will be described below.

(4) Fourth Embodiment

Figure 9:
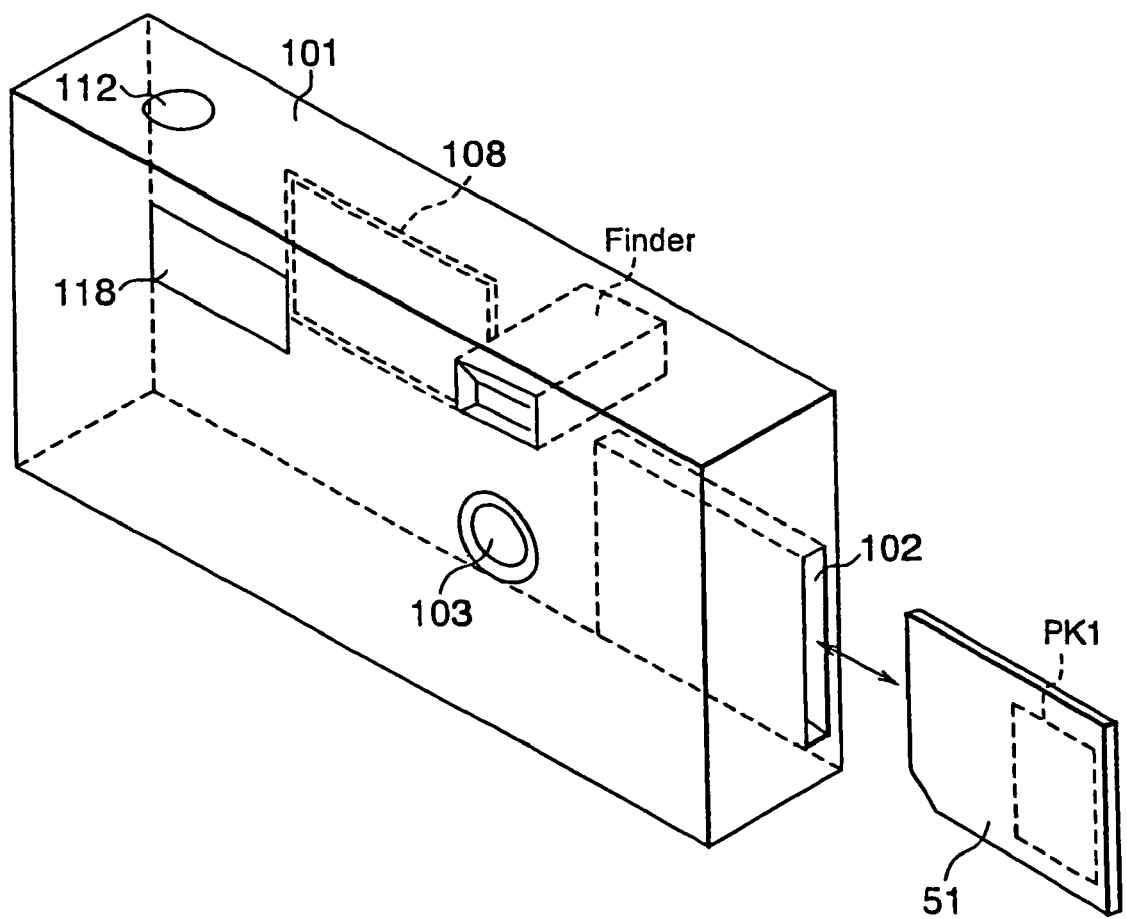
FIG. 9 is a block diagram showing an electric card and the arrangement of an electric device with which this electric card can be used according to the fourth embodiment of the present invention.

FIG. 9 shows an electric card according to the fourth embodiment and the arrangement of an electric device using this electric card.

This electric device is a digital still camera as an example of portable electric devices. The electric card is a memory card 51 used as a recording medium of a digital still camera 101. This memory card 51 incorporates an IC package PK1 in which the semiconductor device or nonvolatile semiconductor memory according to the first to third embodiments described above is integrated or encapsulated.

The case of the digital still camera 101 accommodates a card slot 102 and a circuit board (not shown) connected to this card slot 102.

The memory card 51 is detachably inserted in the card slot 102 of the digital still camera 101. When inserted in this card slot 102, the memory card 1 is electrically connected to electronic circuits on the circuit board.

If this electric card is a non-contact-type IC card, the electric card is electrically connected to the electronic circuits on the circuit board by radio signals when inserted in or approached to the card slot 102.

Figure 10:
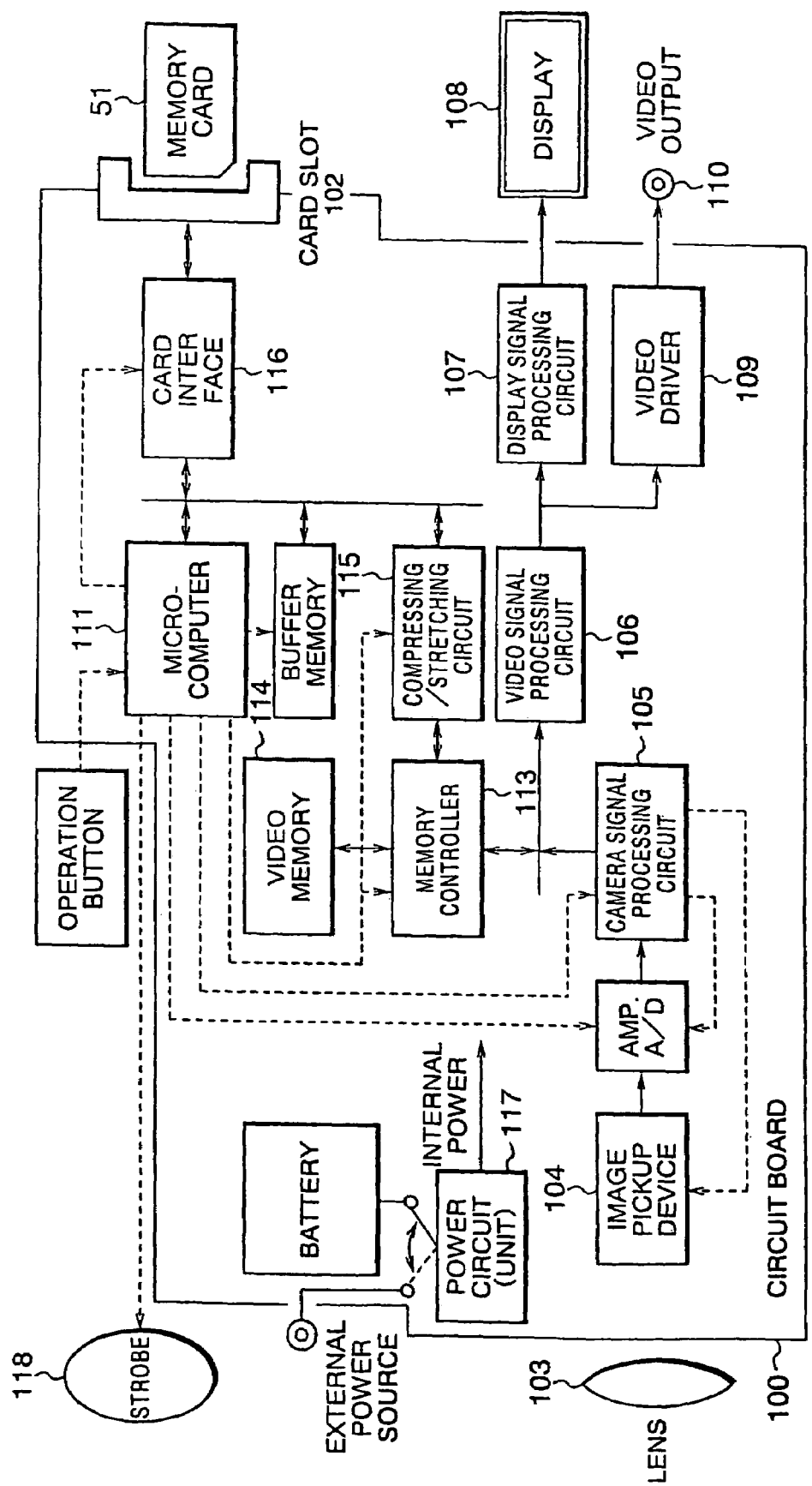
FIG. 10 is a block diagram showing the arrangement of the electric device.
Figure 11A:
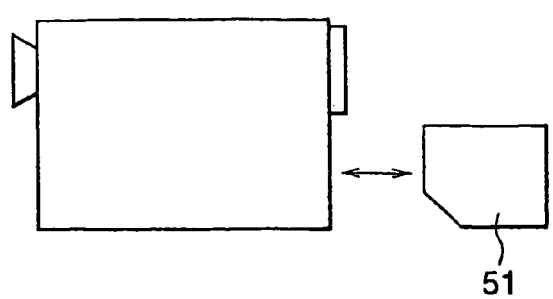
FIGS. 11A to 11J are views for explaining practical examples of the electric device.
Figure 11F:
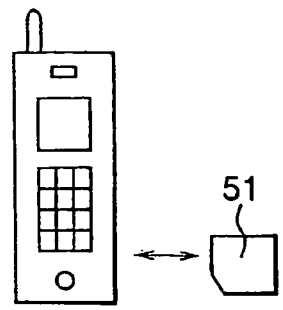
Figure 11B:
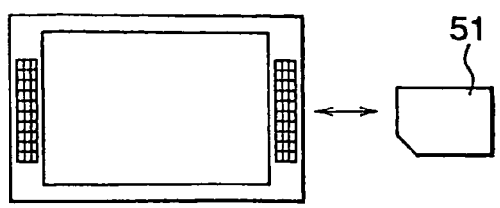
Figure 11G:
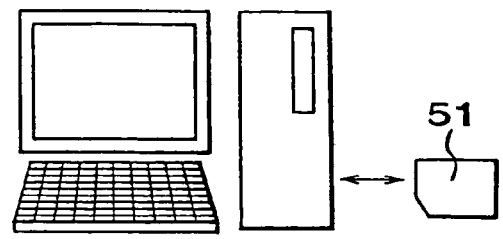
Figure 11C:
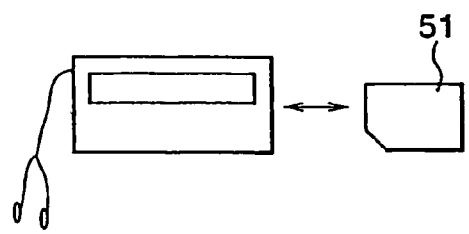
Figure 11H:
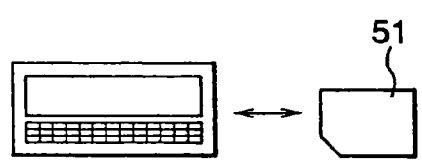
Figure 11D:
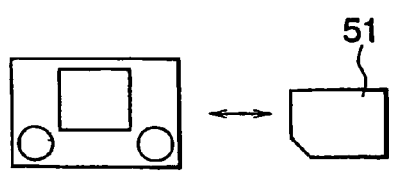
Figure 11I:
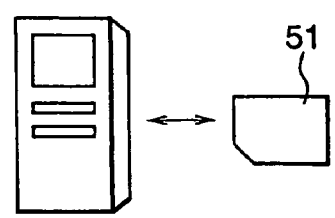
Figure 11E:
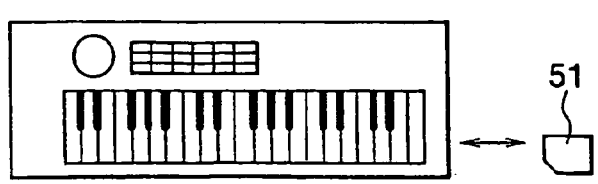
Figure 11J:
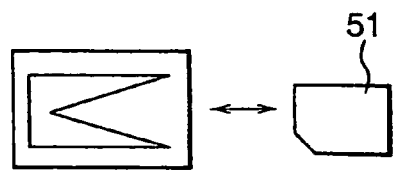
Figure 12:
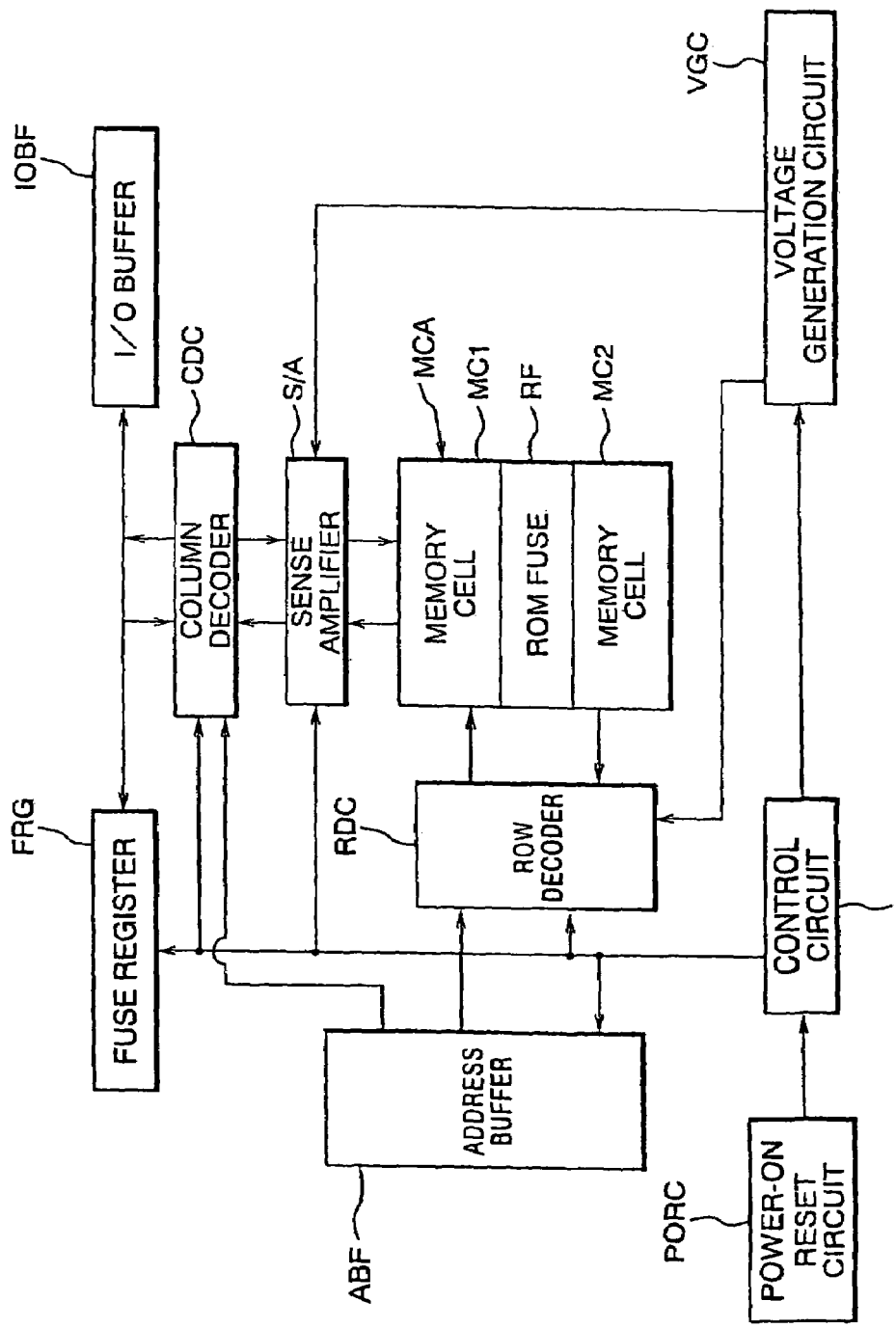
FIG. 12 is a circuit diagram showing the arrangement of a conventional nonvolatile semiconductor memory.
Figure 13:
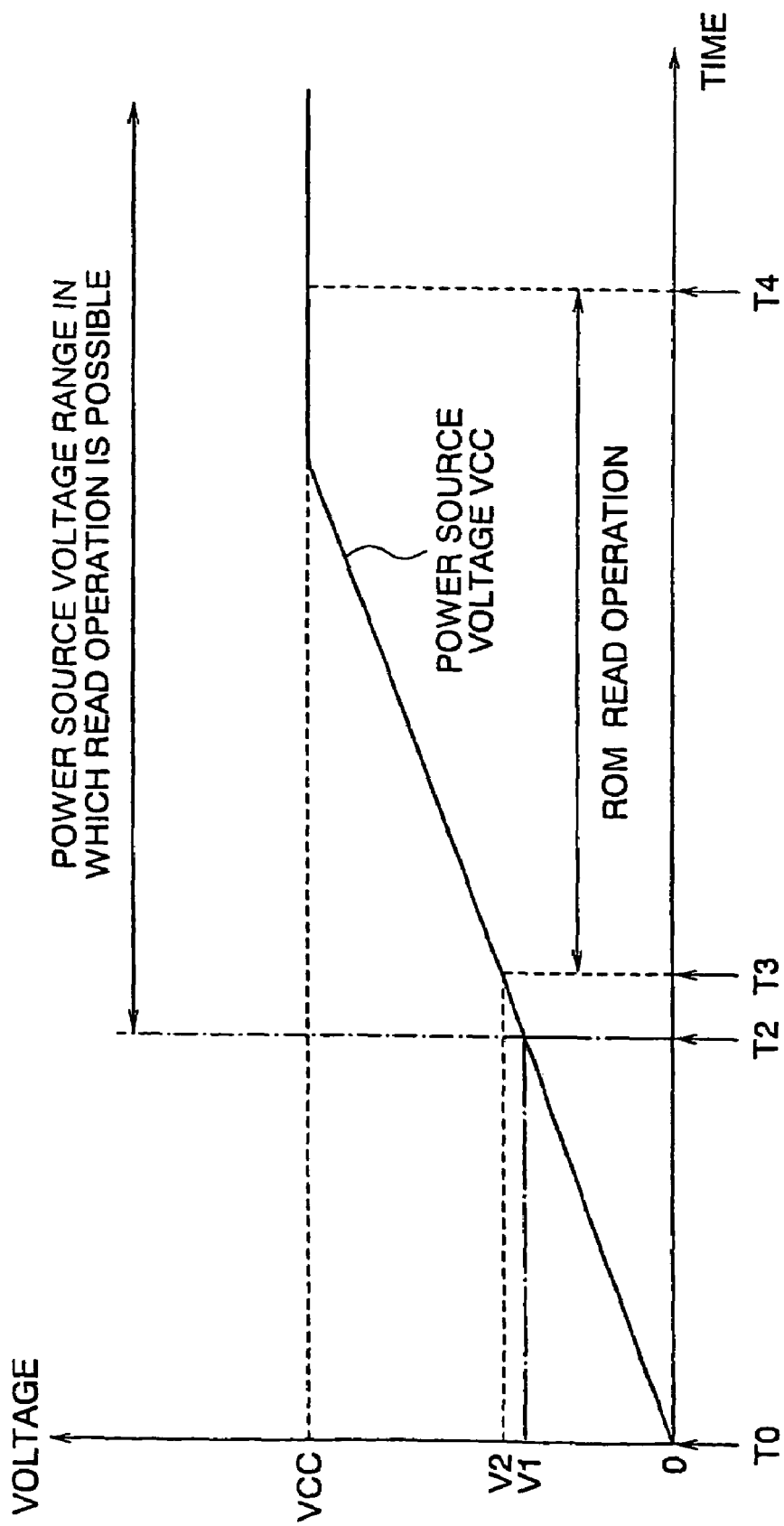
FIG. 13 is a view for explaining a ROM read period after the power source is turned on in the conventional semiconductor memory.
Figure 14:
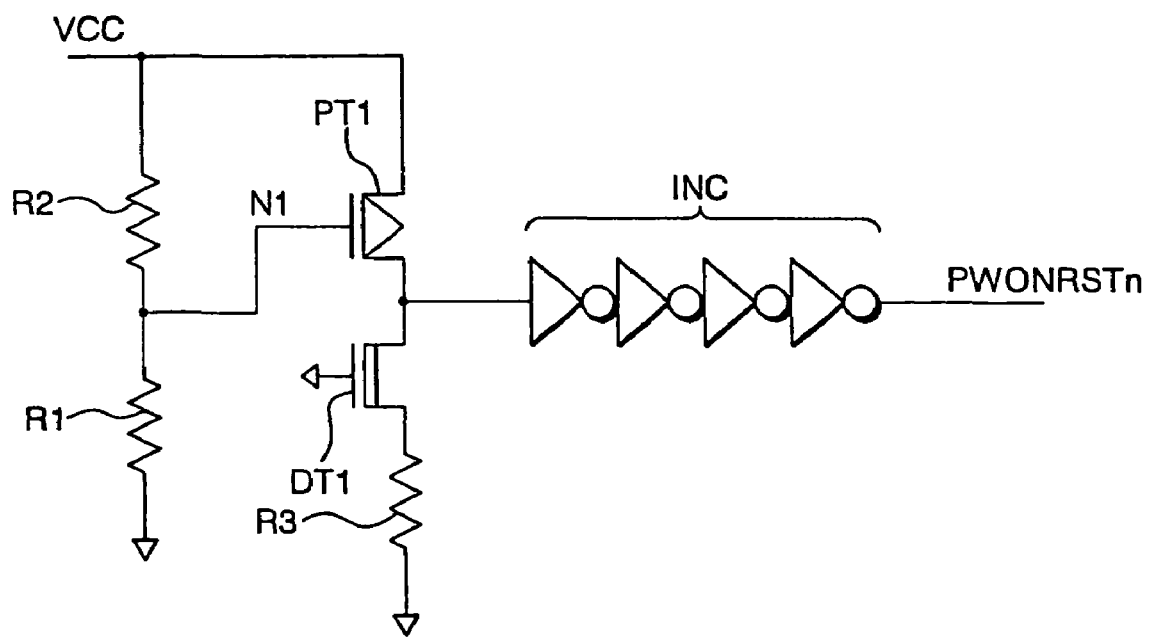
FIG. 14 is a circuit diagram showing the configuration of a power-on reset circuit in the conventional semiconductor memory.
Figure 15:
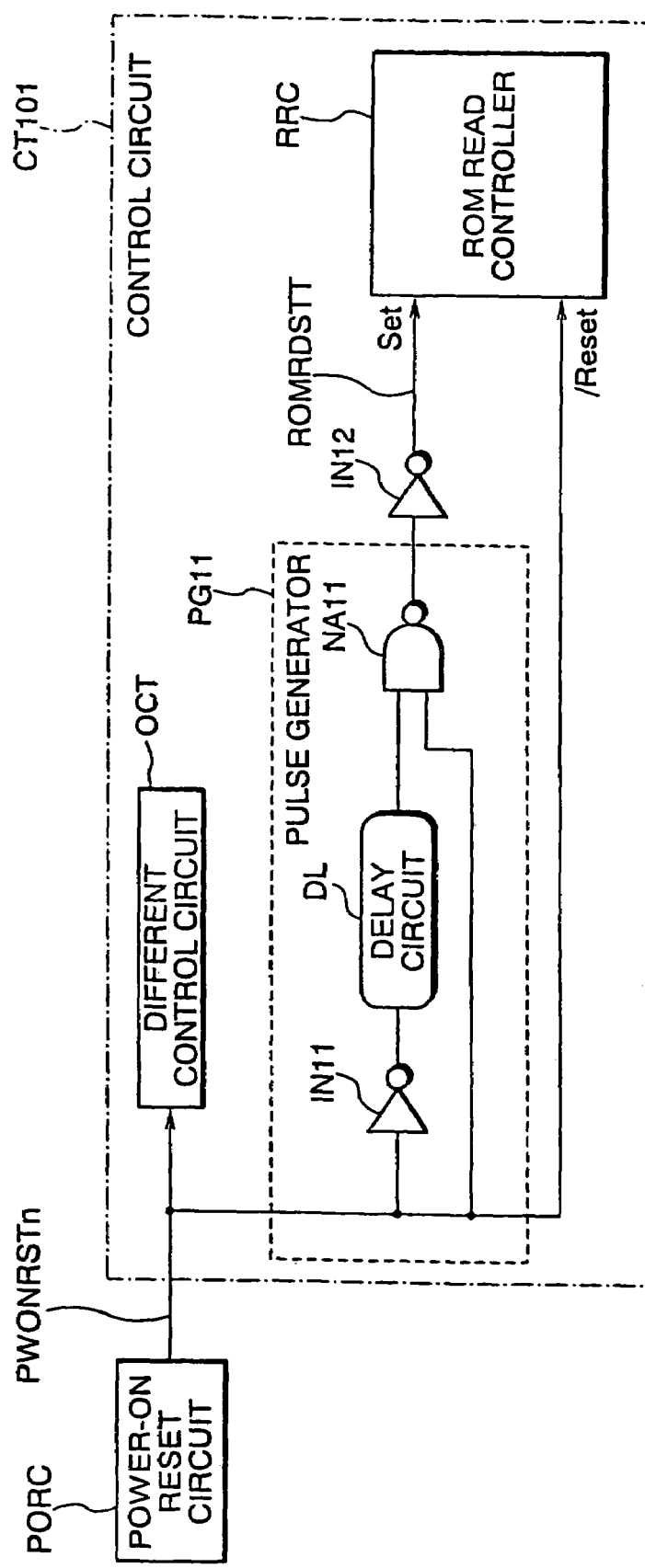
FIG. 15 is a circuit diagram showing the configuration of a control circuit in the conventional semiconductor memory.
Figure 16:
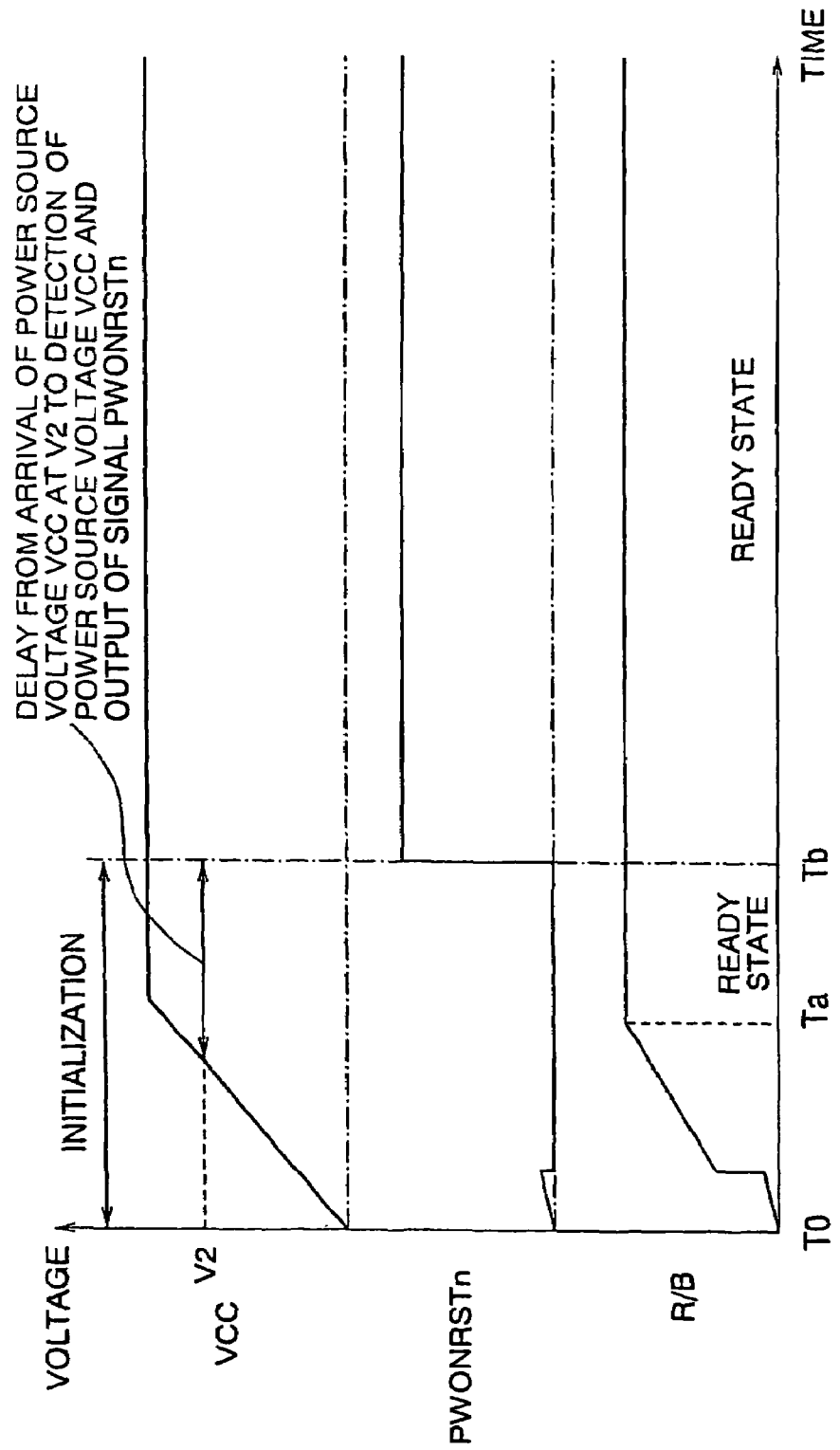
FIG. 16 is a view for explaining the relationship between the period of initialization and the status in the conventional semiconductor memory.

FIG. 10 shows the basic arrangement of the digital still camera.

Light from an object is converged by a lens 103 and input to an image pickup device 104. This image pickup device 104 is, e.g., a CMOS sensor and photoelectrically converts the input light to output, e.g., an analog signal. This analog signal is amplified by an analog amplifier (AMP) and converted into a digital signal by an A/D converter. The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera signal processing circuit 105 is input to a video signal processing circuit 106 and converted into a video signal. The system of this video signal is e.g., NTSC (National Television System Committee).

The video signal is output to a display 108 attached to the digital still camera 101, via a display signal processing circuit 107. This display 108 is, e.g., a liquid crystal monitor.

The video signal is supplied to a video output terminal 110 via a video driver 109. An image picked up by this digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. Accordingly, the microcomputer 111 controls a memory controller 113 to write the output signal from the camera signal processing circuit 105 into a video memory 114 as a frame image. This frame image written in the video memory 114 is compressed on the basis of a predetermined compression format by a compressing/stretching circuit 115. The compressed image is recorded, via a card interface 116, on the memory card 51 inserted in the card slot.

To reproduce a recorded image, an image recorded on the memory card 51 is read out via the card interface 116, stretched by the compressing/stretching circuit 115, and written in the video memory 114. The written image is input to the video signal processing circuit 106 and displayed on the display 108 or another image apparatus in the same manner as when an image is monitored.

In this arrangement, components mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. This power circuit 117 receives power from an external power source or battery and generates an internal power source voltage used inside the digital still camera 101. For example, a DC-DC converter can be used as this power circuit 117. The internal power source voltage is supplied to the individual circuits described above and to a strobe 118 and the display 108.

As described above, the electric card according to this embodiment can be used in portable electric devices such as the digital still camera explained above. However, this electric card can also be used in various apparatuses such as shown in FIGS. 11A to 11J, as well as in portable electric devices. That is, the electric card can also be used in a video camera shown in FIG. 11A, a television set shown in FIG. 11B, an audio apparatus shown in FIG. 11C, a game apparatus shown in FIG. 11D, an electric musical instrument shown in FIG. 11E, a cell phone shown in FIG. 11F, a personal computer shown in FIG. 11G, a personal digital assistant (PDA) shown in FIG. 11H, a voice recorder shown in FIG. 11I, and a PC card shown in FIG. 11J.

The aforementioned embodiments are merely examples and hence do not restrict the present invention. For example, the present invention is applicable to all semiconductor devices which perform initialization. In addition, the present invention can be applied to any storage device in which fuse data can be written in a redundancy circuit, e.g., a NAND or NOR nonvolatile storage device.

What is claimed is:

1. A method of operating a nonvolatile semiconductor memory device comprising:
   detecting a turn on of power;
   outputting a busy status;
   performing an initialization operation; and
   terminating output of the busy status after the power level reaches a predetermined level.

2. The method according to claim 1, wherein if a command is input by a user during outputting the busy status, the command is put on hold and, after outputting the busy status is terminated, the command is executed.

3. The method according to claim 1, wherein the busy status is output from an R/B pad of the nonvolatile memory device.

4. The method according to claim 1, wherein the busy status is output from an I/O pad of the nonvolatile memory device.

5. The method according to claim 1, wherein the initializing operation includes a period until a power source voltage reaches a power on detect level.

6. The method according to claim 1, wherein the nonvolatile memory device is a NAND type nonvolatile storage memory.

7. The method according to claim 1, wherein the nonvolatile memory device comprises,
   a memory cell array having a plurality of memory cells for storing data,
   an address buffer for storing column and row address of the memory cell array,
   a column decoder for decoding the column address stored in the address buffer,
   a row decoder for decoding the row address stored in the address buffer,
   a sense amplifier for sensing and amplifying data read out from the memory cell array, and
   a voltage generation cfrcuit for generating a voltage required for writing data to or reading out data from the memory cell array.

8. A method according to claim 5, wherein the initialization operation includes reading out data from a fuse data storage in the memory cell array.

9. A method of operating a nonvolatile semiconductor memory device comprising:
   detecting a turn on of power;
   outputting a busy status;
   performing an initialization operation; and
   terminating output of the busy status after the power level reaches a predetermined level,
   wherein detecting the turn on of power, outputting the busy status, and performing the initialization operation are performed sequentially in order.

10. A method of operating a nonvolatile semiconductor memory device comprising:
    detecting a turn on of power;
    outputting a busy status;
    performing an initialization operation; and
    terminating output of the busy status after the power level reaches a predetermined level,
    wherein detecting the turn on of power, outputting the busy status, performing the initialization operation, and terminating output of the busy status are performed sequentially in order.

11. The method according to claim 10, wherein if a command is input by a user during outputting the busy status, the command is put on hold and, after outputting the busy status is terminated, the command is executed.

12. The method according to claim 10, wherein the busy status is output from an R/B pad of the nonvolatile memory device.

13. The method according to claim 10, wherein the busy status is output from an I/O pad of the nonvolatile memory device.

14. The method according to claim 10, wherein the initializing operation includes a period until a power source voltage reaches a power on detect level.

15. The method according to claim 10, wherein the nonvolatile memory device is a NAND type nonvolatile storage memory.

16. The method according to claim 10, wherein the nonvolatile memory device comprises,
    a memory cell array having a plurality of memory cells for storing data,
    an address buffer for storing column and row address of the memory cell array,
    a column decoder for decoding the column address stored in the address buffer,
    a row decoder for decoding the row address stored in the address buffer,
    a sense amplifier for sensing and amplifying data read out from the memory cell array, and
    a voltage generation circuit for generating a voltage required for writing data to or reading out data from the memory cell array.

17. A method according to claim 16, wherein the initialization operation includes reading out data from a fuse data storage in the memory cell array.

* * * * *